United States Patent [19]

Gazard et al.

[11] 4,315,067

[45] Feb. 9, 1982

[54] METHOD FOR MAKING ELECTRON SENSITIVE NEGATIVE RESIST

[75] Inventors: Maryse Gazard; Armand Eranian; Francoise Barre; Claude Duchesne, all of Paris, France

[73] Assignee: Thomson-CSF, Paris, France

[21] Appl. No.: 167,036

[22] Filed: Jul. 9, 1980

Related U.S. Application Data

[63] Continuation of Ser. No. 57,089, Jul. 12, 1979, abandoned, which is a continuation of Ser. No. 798,169, May 18, 1977, abandoned.

[30] Foreign Application Priority Data

May 21, 1976 [FR] France .............................. 7615520

[51] Int. Cl.$^3$ ................................................ G03C 1/71
[52] U.S. Cl. ............................ 430/296; 204/159.16; 427/43.1; 427/44; 427/93; 427/96; 430/311; 430/312; 430/315; 430/910; 430/942; 526/256
[58] Field of Search ....................... 204/159.16, 159.14; 427/43.1, 96, 44, 93, 95; 430/942, 312, 311, 315, 296, 910, 942

[56] References Cited

U.S. PATENT DOCUMENTS

| | | | |
|---|---|---|---|
| 3,364,184 | 1/1968 | Krukziener | 525/326 X |
| 3,404,158 | 10/1968 | Yu | 526/256 |
| 4,130,424 | 12/1978 | Feit | 430/271 |

*Primary Examiner*—C. A. Henderson
*Attorney, Agent, or Firm*—Oblon, Fisher, Spivak, McClelland & Maier

[57] ABSTRACT

A polymerized resin capable, upon electronic irradiation, of undergoing a cross-linking completing the polymerization and rendering it insoluble in certain solvents. Such a negative resin is ten times more sensitive to electrons than the best known resin. It is obtained by copolymerization of an epithiopropylmethacrylate:

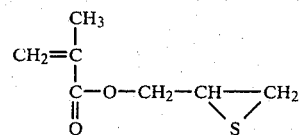

and of a vinyl monomer such as methyl methacrylate.

12 Claims, No Drawings

METHOD FOR MAKING ELECTRON SENSITIVE NEGATIVE RESIST

This a continuation of application Ser. No. 57,089 filed July 12, 1979 now abandoned, which is a continuation of Ser. No. 789,169, filed May 18, 1977, now abandoned.

BACKGROUND OF THE INVENTION

1. Field of the Invention

The invention relates to negative resins sensitive to electrons, that is, resins capable of undergoing, under the action of an electronic irradiation to which a sufficient energy is imparted, a transformation which renders them resistant to certain chemical agents or insoluble in certain solvents. The invention also relates to a process for producing said resin.

2. Description of the Prior Art

It is known that in the production of electronic circuits, in particular in integrated microelectronics, the use of electrons permits the production of masks whose pattern is defined with a better definition than if photons were used as in conventional masking. Synthetic resins sensitive to electrons have consequently been produced. There is given hereinafter the sensitivity for electrons of 20 KeV, of resins selected from among generally negative resins, which are the most sensitive known at the present time (the sensitivities being given for a quantity of 70% of resin transformed by the irradiation).

resins having the commercial references KPR and KTFR (KODAK registered mask), sensitive to a quantity of electricity of 0.1 coulomb per square meter;
polyvinylsiloxane: sensitivity of 0.05 C/sq.m;
glycidylpolymethacrylate: sensitivity of 0.01 C/sq.m.

SUMMARY OF THE INVENTION

The invention permits the obtainment of a resin which has a sensitivity about ten times higher than the best of the aforementioned resins and is easy to use as a negative resin. The new resin obtained has the required properties of adherence and resistance to the chemical agents to enable it to be used in the production of integrated circuits in microelectronics.

DESCRIPTION OF THE PREFERRED EMBODIMENTS

The resin according to the invention is a copolymer of 2,3 epithiopropylmethacrylate of the general formula:

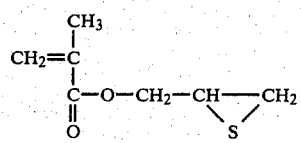

and a vinyl monomer of the formula:

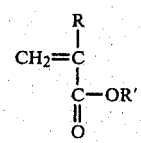

wherein R is an H radical or an alkyl group, $C_nH_{2n+1}$ with n an integer of 1 to 10, R' being an alkyl group having 1 to 5 carbon atoms.

The proportion of vinyl monomers may range up to 20 to 60% by weight (lower limit 15 to 25%, upper limit 55 to 65%).

Among the vinyl monomers may be mentioned methyl methacrylate, butyl methacrylate and ethyl acrylate.

The ensuing description gives one manner of preparing the resin according to the invention, then an example of the process of utilization of this resin for obtaining a manufacturing mask.

Preparation of the resin:
there is used as starting material glycidyl methacrylate of formula:

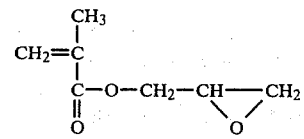

which is reacted at room temperature in a mixture of water and ethanol with thiourea of formula:

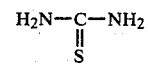

The reaction gives 2.3 epithiopropylmethacrylate of formula:

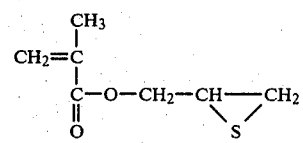

This body is solved in ether. The solution is dried with sodium sulphate. The ether is removed under a vacuum and remaining product is distilled under a vacuum.

The epithiopropylmethacrylate obtained is mixed with an amount of vinyl monomer in a proportion of 20 to 60% by weight of the latter in a solvent such as benzene. Azobisisobutyronitrile is added which acts as a catalyst of copolymerization. The mixture is heated to 80° C. under nitrogen for a period which may vary from one to several hours. After cooling, the copolymer is obtained by precipitation with methanol and then dried under a vacuum.

PROCESS OF UTILIZATION OF THE RESIN (a) Principle:

The resin obtained is dissolved in a solvent such as methylethylcetone. The solution is deposited on a substrate placed on a centrifuge device. Depending on the speed of rotation of the substrate there is obtained a layer of variable thickness for example from 0.2 to 0.5 micrometer. Heat treating at a temperature between 50° C. and 80° C. for half an hour eliminates the solvent.

The irradiation is carried out in an evacuated chamber by means of a beam of electrons the accelerator voltage of which is between 5 and 20 kilovolts for a time sufficient to absorb a charge density of between $10^{-3}$ and $5 \times 10^{-3}$ C/sq.meter.

The resin is developed by means of a solvent such as acetone which dissolves the resin parts which are untransformed by the irradiation (uncrosslinked).

A heat treatment of one to several tens of minutes at 120° C. increases the properties of adherence of the resin for the purpose of the subsequent operations carried out by means of the mask obtained by development.

(b) Example:

0.015 g of azobisisobutyronitrile is dissolved in a solution containing 7.6 g of epithiopropylmethacrylate and 2.4 g of methylmethacrylate in 30 milliliters of benzene.

The solution is heated at 80° C. for an hour and a half under nitrogen. After cooling, the solution is poured into a mixture of methanol and hexane. The polymer precipitated is dried under a vacuum and then dissolved in methylethylcetone to obtain a 10% solution of resin by weight.

This resin solution is deposited by centrifugation on a glass plate covered with a chromium layer: with a speed of rotation of 5000 rpm a layer 0.38 micron thick is obtained. The plate is treated for half an hour at 80° C. to eliminate the solvent.

The irradiation is effected for example with a beam of 20 KeV and a charge density of $5 \times 10^{-3}$ C/sq.m. The duration of the irradiation is calculated in taking into account the total quantity of charges flowing per second (current in amperes) and the useful area in square meters. The development is effected with acetone and lasts only half a minute. After annealing at 120° C. for 10 minutes the plate is immersed in an alkaline solution of potassium ferricyanide for the engraving of the chromium.

The numbers of pairs of lines per millimeter which can be engraved with a mask obtained by the process employing the resin according to the invention is 500. The thickness of a line and the distance between two lines are of the order of a micron. The invention is applicable to the production of masks of silica on a silicon semiconductor substrate and more generally to the engraving of a deposit of any nature on an integrated microelectronic circuit.

What we claim is:

1. A method for preparing an electron sensitive negative resist which comprises:
   contacting a substrate with a solution comprising a solvent and a copolymer having units of the formula (I)

$$CH_2=C\begin{matrix}CH_3\\|\\|\\C-O-CH_2-CH\\\|\\O\end{matrix}\begin{matrix}S\\/\ \backslash\\CH_2\end{matrix}$$

and units of formula (II):

$$CH_2=C\begin{matrix}R\\/\\\backslash\\C-OR'\\\|\\O\end{matrix}$$

wherein R is H or a $C_1$-$C_{10}$ alkyl group, and R' is a $C_1$-$C_5$ alkyl group, and wherein said units of formula (II) are present in a proportion of 15-65% of said copolymer;
   removing said solvent to thereby deposit said copolymer on said substrate; and
   irradiating said copolymer with a beam of electrons for a time sufficient to absorb a charge density of between $10^{-3}$ and $5 \times 10^{-3}$ coulombs/sq. meters.

2. The method of claim 1, wherein said units of formula (II) are present in a proportion of 15-65% of said copolymer.

3. The method of claim 1, wherein said unit of formula (II) is methyl methacrylate.

4. The method of claim 1, wherein said unit of formula (II) is butyl methacrylate.

5. The method of claim 1, wherein said unit of formula (II) is ethyl methacrylate.

6. The method of claim 1, wherein said solvent is methylethyl acetone.

7. The method of claim 1, wherein said copolymer is deposited to a thickness of 0.2-0.5 microns.

8. The method of claim 1, wherein said irradiation is carried out with electrons of 5 to 20 kilovolts.

9. The method of claim 1, which further comprises developing said irradiated copolymer with a developing solvent.

10. The method of claim 1, which also comprises heat treating said deposited copolymer from 50 to 80° C.

11. The method of claim 1, which also comprises heat treating said irradiated copolymer at about 120° C.

12. The method of claim 1, wherein said substrate is silica.

* * * * *